United States Patent [19]

Asano et al.

[11] Patent Number: 4,939,395

[45] Date of Patent: Jul. 3, 1990

[54] TEMPERATURE COMPENSATING CIRCUIT

[75] Inventors: Ichiro Asano; Nobutaka Kihara; Satoshi Inoue, all of Miyanohigashi, Japan

[73] Assignee: Horiba, Ltd., Kyoto, Japan

[21] Appl. No.: 268,585

[22] Filed: Nov. 8, 1988

[51] Int. Cl.$^5$ .................... H03K 3/017; H03K 3/013; H03K 5/156; H03K 17/14

[52] U.S. Cl. .................................. 307/491; 307/296.3; 307/310; 307/265; 307/266; 307/267; 307/519

[58] Field of Search ..................... 307/491, 310, 296.3, 307/296.1, 265, 266, 267, 268, 261, 260, 264, 519, 353

[56] References Cited

U.S. PATENT DOCUMENTS

| | | | |
|---|---|---|---|
| 3,926,478 | 12/1975 | Ruof | 307/519 X |
| 4,314,197 | 2/1982 | Sandler et al. | 307/632 X |
| 4,334,186 | 6/1982 | Sasayama et al. | 307/353 X |
| 4,338,531 | 7/1982 | Corso | 307/264 X |
| 4,713,558 | 12/1987 | Russell et al. | 307/264 |
| 4,727,331 | 2/1988 | Hegeler | 307/265 X |
| 4,728,816 | 3/1988 | Wilke | 307/265 X |
| 4,765,184 | 8/1988 | Delatorre | 307/491 X |
| 4,766,304 | 8/1988 | Kihara et al. | 307/310 X |
| 4,847,577 | 7/1989 | Gerhart et al. | 307/234 X |

FOREIGN PATENT DOCUMENTS 5744869 of 0000 Japan .
60146072 of 0000 Japan .

Primary Examiner—Stanley D. Miller
Assistant Examiner—David R. Bertelson
Attorney, Agent, or Firm—Price, Gess & Ubell

[57] ABSTRACT

A temperature compensating circuit designed in two parts, a temperature-pulse width conversion circuit (X) and a temperature compensating circuit ($Y_N$) permit the sharing of the temperature-pulse width conversion circuit by a plurality of temperature compensating circuits. Each temperature conversion circuit is relatively uncomplicated in construction, utilizing only resistors and a switch means. The temperature-pulse width conversion circuit utilizes a temperature sensitive element, like a thermistor, in a circuit with an operational amplifier. The output of the operational amplifier is supplied to a pulse width converter for generating the pulse width signal that carries the temperature compensation factor to be used in temperatures compensating the signal received by the temperature compensating circuit.

9 Claims, 5 Drawing Sheets

TEMPERATURE COMPENSATING CIRCUIT

BACKGROUND OF THE INVENTION

1. Field of the Invention

The present invention relates to temperature compensating circuits for compensating measured signals by analyzers, such as a gas analyzer, for example, for temperature variation.

2. Description of the Prior Art

Whenever accurate measurements are required, temperature compensation circuits are utilized to ensure that the accuracy of the measurement is not affected by changes in temperature in the environment of the measuring instrument.

A dissolved oxygen meter, for example, may have a plurality of displays, such as the display of dissolved oxygen in partial pressure ratio, and the display of dissolved oxygen (DO) in concentration, in addition to the display of the detected temperature itself. Each of the measured signals on which this multiple display is based must be individually temperature compensated. Other gas analyzers can analyze concentrations of a plurality of different kinds of gases. Here again, it is necessary to temperature compensate the detected signals of the concentrations of the respective gases.

Prior art temperature compensating circuits generally utilize a temperature sensitive (resistance) element $r_T$ in a feedback circuit of an operational amplifier "a" as shown in FIGS. 5A and 5B. The measured signal V to be compensated is supplied to the input circuit of said operational amplifier "a." Any one of many such input circuits may be selected, depending upon the characteristics of the measured signal. The gain of operational amplifier "a" depends upon and is changed with the temperature. The output signal $V_o$ is the input signal V subjected to temperature compensation.

Temperature compensating circuits having the above-described conventional construction have various kinds of disadvantages. One temperature compensating circuit, having an operational amplifier and a temperature sensitive (resistance) element $r_T$ is necessary for each measured signal V. In the case where temperature compensation is needed for a plurality of measured signals, the number of parts is remarkably increased, increasing not only the cost of production, but also complicating the construction and increasing the physical size.

Since complicated calculations are necessary for determining the characteristics of the temperature sensitive (resistance) element $r_T$ and the resistance values of the other resistors $r_a$, $r_b$, $r_c$, depending upon the temperature characteristics of the measured signal V, the design and construction of a multiple sensing temperature compensating circuit according to this prior art teaching becomes quite complicated.

The circuit construction for each temperature compensating circuit may be quite different in structure, as shown in FIGS. 5A and B. Each must be selectively adopted, depending upon the polarity of the temperature characteristics of the measured signal V. In the case where temperature compensation for a plurality of measured signals different in polarity and temperature characteristics is required, the design and construction thereof is complicated even more.

Since the operational amplifier "a," an indispensable constituent element of the circuit, is apt to produce errors itself (temperature drift and the like) due to the influence of the surrounding temperature, these temperature compensation circuits still provide inaccuracy.

Applicants have recently developed a temperature compensating circuit capable of temperature compensation for a plurality of measured signals, by means of only one temperature sensitive element. This temperature compensating circuit has been described in Japanese Patent Application No. Sho 57-44869 (Japanese Patent Laid-Open No. Sho 58-160859), and Japanese Utility Model Application No. Sho 60-146072 (Japanese Utility Model Laid-Open No. Sho 62-53356).

However, even this temperature compensating circuit still has some shortcomings. Even though a temperature compensating circuit for carrying out temperature compensation for a plurality of measured signals is constructed, thereby requiring only one temperature sensitive (resistance) element, a comparatively expensive operational amplifier is still necessary. In addition, the complicated calculations for determining the characteristics of the temperature sensitive element $r_t$ and the resistance values for $r_a$, $r_b$ and $r_c$ are still necessary. The temperature compensating circuit must still be adapted to the temperature characteristics of the measured signal V.

The present invention is an improvement over the above-described prior work. It is an object of the present invention to develop and provide a temperature compensating circuit capable of remarkably reducing a number of constituent parts, simplifying and miniaturizing inexpensively the construction, remarkably simplifying the design procedure corresponding to the temperature characteristics of the measured signal, and carrying out temperature compensation remarkably more accurate than the prior art.

SUMMARY OF THE INVENTION

According to the present invention, these and other objects are attained by providing a temperature compensating circuit having a temperature-pulse width conversion circuit adapted to generate a pulse width signal with a duty ratio that is changed in response to a detected temperature, and at least one temperature compensating circuit adapted to apply a temperature compensating factor to the measured signal to be compensated, said compensating factor being based on the duty ratio of the pulse width signal supplied by the temperature-pulse width conversion circuit. The temperature compensating circuit comprises a voltage-dividing means which receives the input signal and changes it into a large signal and a small signal. The large and small signals are alternately selected for output by a selection switch driven by the high/low transitions of the pulse width signal supplied from the temperature-pulse width conversion circuit.

BRIEF DESCRIPTION OF THE DRAWINGS

The exact nature of this invention, as well as other objects and many of the attendant advantages of this invention, will be readily appreciated as the same becomes better understood by reference to the following detailed description when considered in conjunction with the accompanying drawings, in which like reference numerals designate like parts throughout the figures thereof, and wherein.

DETAILED DESCRIPTION OF THE PREFERRED EMBODIMENTS

Figure 1A:
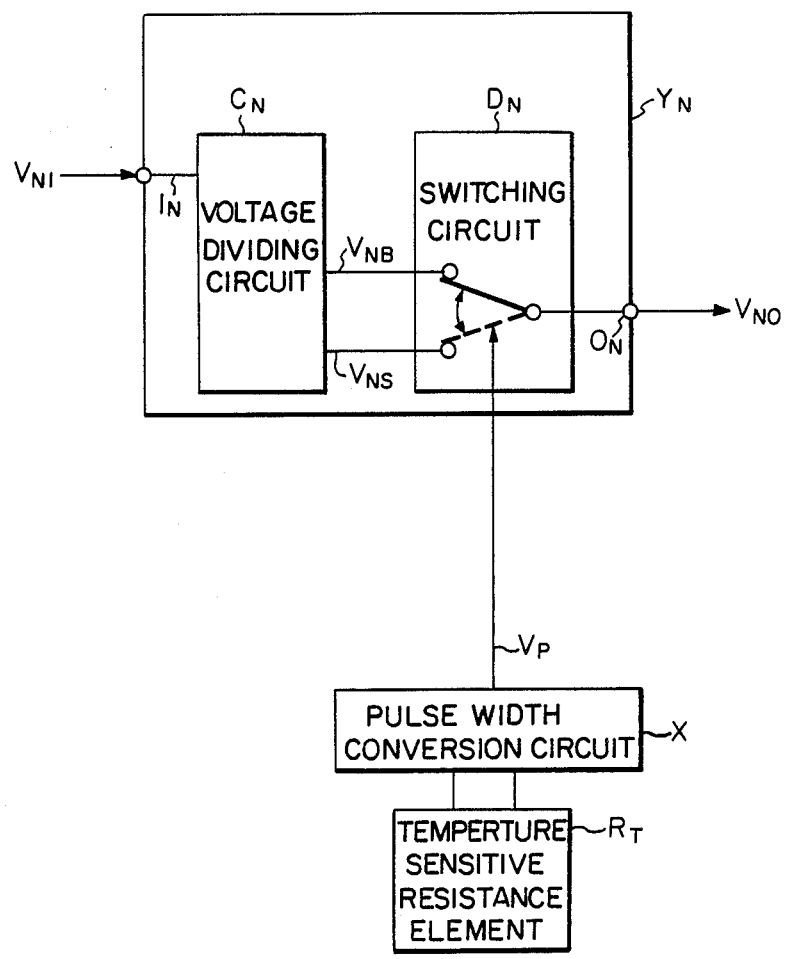
FIG. 1A is a block diagram showing a temperature compensating circuit according to the present invention.
Figure 1B:
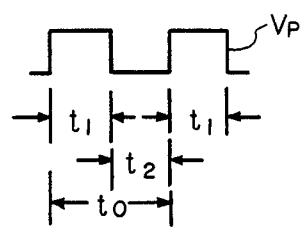
FIG. 1B is a waveform showing the output signal $V_P$ of part of the circuit of FIG. 1A.

In order to achieve its objects, the present invention provides a temperature compensating circuit comprising a temperature-pulse width conversion circuit X (FIG. 1A) adapted to generate a pulse width signal $V_P$, having a duty cycle D (T) (a time ratio of a high period width $t_1$ to a repetition period of pulses $t_0$) (FIG. 1B) that is changed in response to a temperature detected by a temperature sensitive element. At least one temperature compensating circuit $Y_N$ is adapted to apply a temperature compensating factor to a measured signal $V_{NI}$ received at input terminal $I_N$ on the basis of the duty cycle D (T) of the pulse width signal $V_P$. The temperature compensating circuit $Y_N$ then puts out the temperature compensated signal $V_{NO}$ through an output terminal $O_N$.

The temperature compensating circuit portion $Y_N$ comprises voltage-dividing means $C_N$ for dividing the measured signal $V_{NI}$, received at input terminal $I_N$, into a large signal $V_{NB}$ and a small signal $V_{NS}$. These signals are supplied to switching means $D_N$ for alternately selecting said large and small voltage signals $V_{NB}$, $V_{NS}$ ($V_{NB} > V_{NS}$) and providing them to said output terminal $O_N$. Switching means $D_N$ selects in response to the high/low transition of the pulse width signal $V_P$ supplied from the temperature-pulse width conversion circuit X.

The temperature compensating circuit as described above exhibits various kinds of advantages. In the case where the temperature compensating circuit is adapted to carry out temperature compensation for a plurality of measured signals $V_{NI}$ (where N=1, 2, etc.), only a plurality of temperature compensating circuits $Y_N$ (where N=1, 2, etc.) need be provided, one for each measured signal $V_{NI}$ to be compensated. Each of these temperature compensating circuits $Y_N$ is adapted to use a pulse width signal $V_P$, the signal formed by one temperature-pulse width conversion circuit X. The respective temperature compensating circuits $Y_N$ are simple in construction. No operational amplifier is required at this level. Only one operational amplifier and one temperature sensitive element $R_T$, which are comparatively expensive, are required in the temperature-pulse width conversion circuit X. The remarkable reduction of the number of parts directly results in a simplification and miniaturization, as well as in a reduction of the cost of production.

In the temperature compensating circuit $Y_N$ the measured signal $V_{NI}$ is divided in voltage between the large and small signals $V_{NB}$, $V_{NS}$ (where $V_{NB} > V_{NS}$) by means of a voltage dividing means $C_N$, which can be very simply and inexpensively constructed using at least two resistors connected to each other in series. Then said large and small signals $V_{NB}$, $V_{NS}$ are alternately put out to the output terminal $O_N$ (by the switching means $D_N$), depending upon the high/low transition of the pulse width signal $V_P$ supplied from the temperature-pulse width conversion circuit X. The switching means $D_N$ can be constructed using a remarkably simple and inexpensive switching element. A weighted average of said large and small partial voltage signals $V_{NB}$, $V_{NS}$ are switched, depending upon the duty ratio D (T) of said pulse width signal $V_P$. This weighted average is put out on terminal $O_N$ as the measured signal $V_{NO}$, which has been temperature compensated.

In the case of the present invention, the temperature compensating circuits $Y_N$ do not require the use of an operational amplifier, thereby eliminating the expense and making the circuit structure considerably less complicated than the conventional temperature compensating circuits. It does not require the use of the temperature sensitive element. As a result, the determination of the resistance values of the resistors used, depending upon the temperature characteristics of the measured signals $V_{NI}$ supplied to the temperature compensating circuit $Y_N$, can be simply determined.

Even in the case where the temperature characteristics of the measured signals $V_{NI}$ change in polarity, the construction of the circuit as a whole does not require any remarkable change. A very simple change in design is sufficient. For example, a switching means different in switching characteristics is used. The switching means $D_N$ switches alternately, depending upon the high/low transition of the pulse width signal $V_P$ supplied from the temperature-pulse width conversion circuit X. Or, an inversion element may be provided in the signal line extending from the temperature-pulse width conversion circuit X to the switching means $D_N$.

Since the respective temperature compensating circuit $Y_N$ can be constructed without using an operational amplifier which is susceptible to temperature drift and the like due to the surrounding temperature, the temperature compensation is remarkably improved in accuracy in comparison with the conventional circuit.

The preferred embodiments of the temperature compensating circuit according to the present invention are now described with reference to the drawings, FIGS. 2 to 4.

Figure 2:
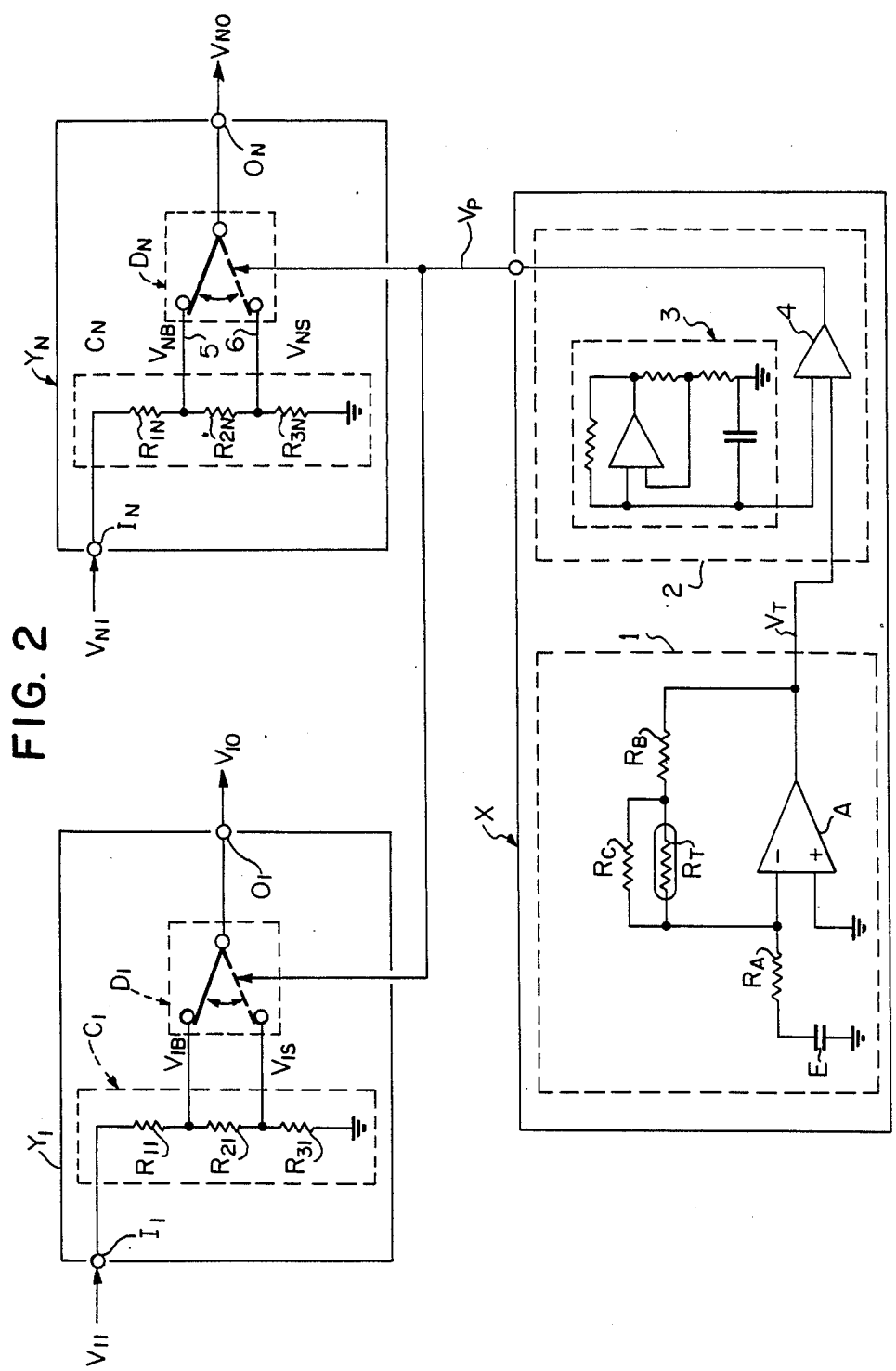
FIG. 2 is a circuit diagram of an embodiment of the present invention.
Figure 3A:
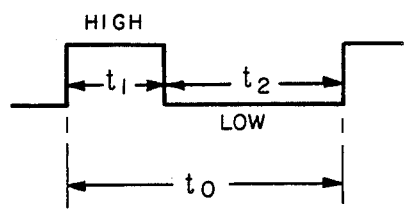
FIGS. 3A, 3B and 3C are waveforms showing the characteristics of the pulse signal in part of the temperature compensating circuit according to the present invention.

FIG. 2 shows a preferred construction of the entire circuit. The temperature-pulse width conversion circuit X is adapted to generate the pulse width signal $V_P$ having a duty ratio D (T), depending upon the temperature detected by the temperature sensitive element $R_T$. Temperature compensating circuits $Y_1 \ldots Y_N$ are connected to said temperature-pulse width conversion circuit X and adapted to apply the temperature compensating factor to the measured signal $V_{NI}$ applied to the input terminal $I_N$. The signal $Y_{NO}$, which has been subjected to temperature compensation, is output at terminal $O_N$.

The temperature-pulse width conversion circuit X comprises a temperature measuring port 1 producing a voltage $V_T$ corresponding to the temperature, and a voltage-pulse width converter 2 putting out the pulse width signal $V_P$. Pulse width signal $V_P$ has a duty ratio D (T), where D (T)=$t_1/t_0$, the time ratio of the high period width $t_1$ to the repetition period of pulses $t_0$. The duty ratio D (T) is changed in proportion to voltage $V_T$ corresponding to the temperature supplied from the temperature measuring circuit port 1. The temperature measuring circuit port 1 comprises feedback resistor $R_B$, the temperature sensitive (resistance) element $R_T$, such as a thermistor, a resistor $R_C$ for improving linearity and the like, provided in the feedback circuit portion of the operational amplifier A. The noninverting input terminal of amplifier A is grounded. The inverting input terminal is connected to a reference power source E and an input resistor $R_A$.

The voltage-pulse width converter 2 utilizes the known construction of a triangular wave generator 3 and a comparator 4. A triangular wave-shaped pulse from the triangular wave generator 3 and the voltage $V_T$ from the temperature measuring circuit port 1 are applied to the comparator 4. The output of comparator 4 is the pulse width signal $V_P$ which is applied to each of the temperature compensating circuits $Y_1 \ldots Y_N$. All the temperature compensating circuits have the same construction. Only the N-th temperature compensating circuit $Y_N$ will be described. It includes a first resistor $R_{1N}$, a second resistor $R_{2N}$, and a third resistor $R_{3N}$ connected in series. The measured signal $V_{NI}$ applied to the input terminal $I_N$ is divided thereby into a large signal $V_{NB}$ and a small signal $V_{NS}$ ($V_{NB} > V_{NS}$). This voltage-dividing circuit $C_N$ comprises a signal output line 5 and a signal output line 6 extending from between the first resistor $R_{1N}$ and the second resistor $R_{2N}$, and between the second resistor $R_{2N}$ and the third resistor $R_{3N}$. A switching means $D_N$ comprising a switching element, such as an analog switch, receives the large and small partial voltage signals $V_{NB}$, $V_{NS}$ supplied over the signal output lines 5, 6 from the voltage-dividing means $C_N$. Switching means $D_N$ alternately puts out either $V_{NB}$ or $V_{NS}$ to said output terminal $O_N$, depending upon the high/low transition of the pulse width signal $V_P$ supplied from the temperature-pulse width conversion circuit X. In short, the weighted average value of large and small partial voltage signals $V_{NB}$, $V_{NS}$ are changed, depending upon the duty ratio D (T) of the pulse width signal $V_P$. This results in the temperature compensated signal $V_{NO}$ at the output terminal $O_N$.

The switching characteristics of said switching means $D_N$ may be suitably determined, depending upon the polarity of the measured signal $V_{NI}$. But, in the case where a switching means having the same switching characteristics is used regardless of the polarity of the measured signal $V_{NI}$, an inverting element N may be provided in the signal line from the temperature-pulse width conversion circuit X to the switching means $D_N$.

In the temperature compensating circuit having the above-described construction, if the switching means $D_N$ is set so as to have the switching characteristic that the large partial voltage signal $V_{NB}$ is connected to the output terminal $O_N$ when the pulse width signal $V_P$ is High, while the small partial voltage signal $V_{NS}$ is connected to the output terminal $O_N$ when the pulse width signal $V_P$ is Low, the weighted average value $V_{NO}$ of said large and small partial voltage signals $V_{NB}$, $V_{NS}$ put out to the output terminal $O_N$ is expressed by the following equation:

$$V_{NO} = V_{NB} \cdot \frac{t_1}{t_0} + V_{NS} \cdot \frac{t_2}{t_0} \quad (1)$$

Here, $$V_{NB} = \frac{R_{2N} + R_{3N}}{R_{1N} + R_{2N} + R_{3N}} \cdot V_{NI},$$

$$V_{NS} = \frac{R_{3N}}{R_{1N} + R_{2N} + R_{3N}} \cdot V_{NI},$$

$$\frac{t_1}{t_0} = D(T),$$

$$\frac{t_2}{t_0} = \frac{t_0 - t_1}{t_0} = 1 - D(T)$$

hold good, so that the following equation (2) is derived from the above-described equation (1).

$$\frac{V_{NO}}{V_{NI}} = \frac{R_{3N}}{R_{1N} + R_{2N} + R_{3N}} \times \left( 1 + \frac{R_{2N}}{R_{3N}} D(T) \right) \quad (2)$$

That is to say, a temperature coefficient $V_{NO}/V_{NI}$ of the temperature compensating circuit $Y_N$ is dependent upon said duty ratio D (T) of the pulse width signal $V_P$. In short, the temperature coefficient depends on the temperature characteristics of the temperature-pulse width conversion circuit X:

$$R_{3N}/(R_{1N}+R_{2N}+R_{3N}) \text{ and } R_{2N}/R_{3N}.$$

On the other hand, in the case where switching means $D_N$ is set so as to have the switching characteristics opposite to those in the above-described case, the weighted average value $V_{NO}$ of said large and small partial voltage signals $V_{NB}$, $V_{NS}$ put out to the output terminal $O_N$ is expressed by the following equation:

$$V_{NO} = V_{NB} \cdot \frac{t_2}{t_0} + V_{NS} \cdot \frac{t_1}{t_0}$$

so that the temperature coefficient $V_{NO}/V_{NI}$ of the temperature compensating circuit portion $Y_N$ is expressed by the following equation:

$$\frac{V_{NO}}{V_{NI}} = \frac{R_{2N} + R_{3N}}{R_{1N} + R_{2N} + R_{3N}} \times \left( 1 - \frac{R_{2N}}{R_{2N} + R_{3N}} D(T) \right) \quad (3)$$

That is to say, the temperature coefficient $V_{NO}/V_{NI}$ of the temperature compensating circuit $Y_N$ is dependent upon the duty ratio D (T) of the pulse width signal $V_P$ $(R_{2N}+R_{3N})/(R_{1N}+R_{2N}+R_{3N})$ and $R_{2N}/(R_{2N}+R_{3N})$.

Accordingly, in every case, the above-described equation (2) or (3) provide a clear guide for the first resistor $R_{1N}$, the second resistor $R_{2N}$, and the third resistor $R_{3N}$ in the voltage-dividing circuit $C_N$. Because the resistors are simply connected in series, the design calculations are suitable determining the respective resistance values of the first resistor $R_{1N}$, the second resistor $R_{2N}$, and the third resistor $R_{3N}$, depending upon the temperature characteristics of the measured signal $V_{NI}$ can be very easily conducted.

Figure 3B:
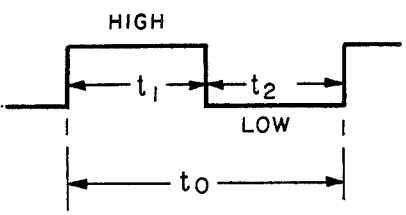
Figure 3C:
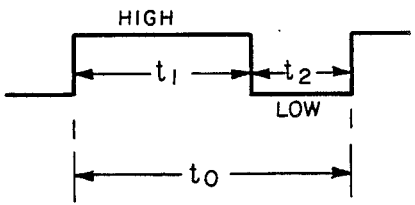

If the resistance value of the first resistor $R_{1N}$ is set so as to be equal to that of the third resistor $R_{3N}$ and the second resistor $R_{2N}$ is a variable resistor, and the temperature-pulse width conversion circuit X is set so that the duty ratio D (T) of the pulse width signal $V_P$ is 0.5 when the temperature T is equal to the reference temperature $T_0$ (for example, 20° C.), as shown in FIG. 3B, the temperature coefficient $V_{NO}/V_{NI}$ of the temperature compensating circuit $Y_N$ is expressed as follows:

That is to say, if $$D(T) = D(T_0) + \Delta D(T)$$
$$= 0.5 + \Delta D(T)$$

is put in equation (3), $$\frac{V_{NO}}{V_{NI}} = \frac{R_{3N} + 0.5R_{2N}}{R_{1N} + R_{2N} + R_{3N}}$$

$$\left[1 - \frac{R_{2N}}{R_{3N} + 0.5R_{2N}} \Delta D(T)\right]$$

holds good, so that, now if $$D(T) = D(T) - 0.5$$

$$R_{1N} = R_{3N}$$

are put in the above-described resulting equation, the following equation is obtained:

$$\frac{V_{NO}}{V_{NI}} + \tfrac{1}{2} \times \left[1 - \frac{R_{2N}}{R_{3N} + 0.5R_{2N}} \{D(t) - 0.5\}\right] \quad (4)$$

It is found from this equation (4) that since D (t)=0.5 holds good when the temperature T is equal to the reference temperature $T_0$, the temperature coefficient $V_{NO}/V_{NI}$ constantly amounts to ½ regardless of the resistance value of the second resistor $R_{2N}$. The output $V_{NO}$ from the temperature compensating circuit $Y_N$ is therefore unchanged even though the variable resistor $R_{2N}$ is adjusted to any value. A great advantage occurs in this case in that the temperature coefficient of the temperature compensating circuit $Y_N$ can be very easily adjusted, depending upon the temperature characteristics of the individual measured signal $V_{NI}$ by carrying out the remarkably simple operation of adjusting the second resistor $R_{2N}$ so that the output $V_{NO}$ of the temperature compensating circuit $Y_N$ at a temperature T different from the reference temperature $T_0$ (for example 40° C.) may have the same value as that at said reference temperature $T_0$.

In the case where such adaptability and secondary advantage are not desired, the first resistor $R_{1N}$ may be omitted. It is desirable to omit the first resistor $R_{1N}$ from the viewpoint of simplifying the design calculations for determining the needed resistance values.

Figure 4A:
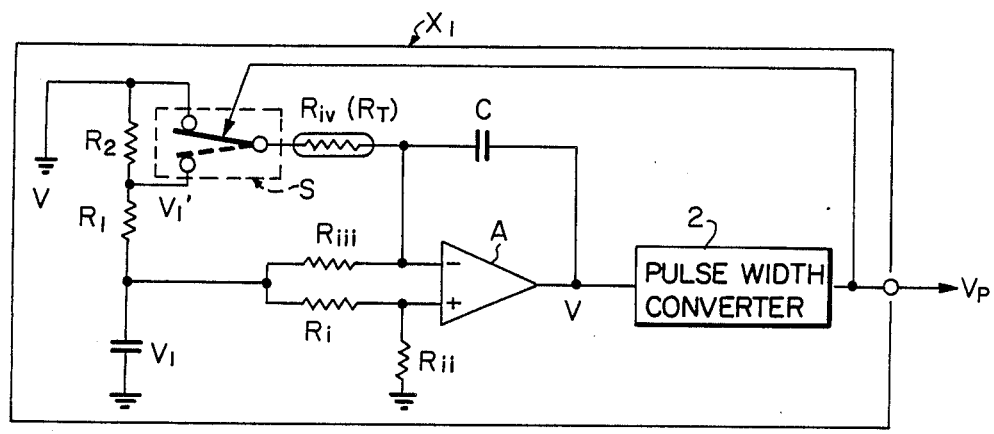
FIG. 4A is a circuit diagram of an alternate preferred embodiment of the present invention.

FIGS. 4A and B show alternate preferred temperature-pulse width conversion circuits X.

The temperature-pulse width conversion circuit X of FIG. 2 has the so-called open loop construction. The voltage $V_T$ corresponding to the temperature is formed by means of the temperature measuring circuit 1. The formed voltage $V_T$ is supplied to the voltage-pulse width converter 2 to obtain the pulse width signal $V_P$ having the duty ratio D (T) corresponding to the temperature. The temperature-pulse width conversion circuits $X_1$ and $X_2$ of FIG. 4 have a closed loop construction.

That is to say, the temperature-pulse width conversion circuit $X_1$ shown in FIG. 4A utilizes an integration circuit for dividing a first reference voltage $V_1$ by means of a first resistor $R_i$ and a second resistor $R_{ii}$ and putting the divided voltages in a noninverting input terminal of an operational amplifier A. The first reference voltage $V_1$ is supplied to the inverting input terminal of the operational amplifier A through a third resistor $R_{iii}$ connected to the first resistor $R_i$ in parallel. The output from the operational amplifier A is supplied back to the inverting input terminal through a condenser C, and is also supplied to a voltage-pulse width converter 2 (having the same construction as the above-described one). The converter 2 forms a pulse width signal $V_P$ having a duty ratio D (T) corresponding to an output voltage V from the integration circuit. A switching means S formed of a switching element, such as an analog switch, carries out the switching operation by the pulse width signal $V_P$ supplied from the voltage-pulse width converter 2 in a feedback manner. The result is that a voltage $V_1'$ obtained by dividing said first reference voltage $V_1$ by means of the voltage dividing resistors $R_1$, $R_2$ and a second reference voltage $V_2$ (in this preferred embodiment, ground voltage=0) is supplied to the inverting input terminal of the operational amplifier A intermittently through a fourth resistor $R_{iv}$. One of the first to fourth resistors $R_i$ to $R_{iv}$ (in this preferred embodiment the fourth resistor $R_{iv}$) is formed of a temperature sensitive (resistance) element $R_T$, such as a thermistor. In this preferred embodiment the switching means S is set so as to have switching characteristics that the partial voltage $V_1'$ of the first reference voltage $V_1$ is connected to the temperature sensitive (resistance) element $R_T$ when the pulse width signal $V_P$ feedback supplied from the voltage-pulse width converter 2 is High while the second reference voltage $V_2$ (ground voltage=0) is connected to the temperature sensitive (resistance) element $R_T$ when the pulse width signal $V_P$ is Low.

The temperature-pulse width conversion circuit X having the above-described construction operates as follows: If the temperature T is rising, whereby the resistance value of the temperature sensitive (resistance) element $R_T$ is increased, the current flowing in the inverting input terminal of the operational amplifier A is reduced. The output voltage V of the operational amplifier A is increased in the positive direction, so that a High period width $t_1$ of the pulse width signal $V_P$ put out from the voltage-pulse width converter 2 is lengthened. The feedback signal is also lengthened, whereby the average voltage supplied to the temperature sensitive (resistance) element $R_T$ from the switch means S is increased. This occurs because the supply period of the partial voltage $V_1'$ of the first reference voltages $V_1$ is lengthened while the supply period of the second reference voltage $V_2$ (earth voltage=0) is shortened. The current flowing in the inverting input terminal of the operational amplifier A is thereby increased, and the output voltage V shows a tendency to be reduced.

As a result, the current flowing in the inverting input terminal of the operational amplifier A will soon amount to 0, and establish a stabilized condition where the output voltage V, from the operational amplifier A, and the pulse width signal $V_P$, put out from the voltage-pulse width converter 2, amount to constant values.

In the case where the temperature T is lowered, the resistance value of the temperature sensitive (resistance) element $R_T$ is reduced. A stabilized condition is established by an operation opposite to the one described above. Under such stabilized condition, $$\frac{V_1}{R_{iii}} + \frac{V_1'}{R_{iv}} \cdot \frac{t_1}{t} - \frac{R_{ii}}{R_i + R_{ii}} \left( \frac{1}{R_{iii}} + \frac{1}{R_{iv}} \right) = 0$$

holds good, so that the following equation holds good.

$$D(T) = \frac{t_1}{t} = \frac{R_{ii}R_{iii} - R_i R_{iv}}{(R_i + R_{ii})R_{iii}} \cdot \frac{1}{K} \quad (5)$$

[wherein $K = V_1'/V_1$ (partial voltage ratio constant)]

Since the resistance values of $R_i$, $R_{ii}$ and $R_{iii}$ and the partial voltage ratio K ($V_1'/V_1$) are all constant in this equation (5), it is clear that the duty ratio D (T) of the pulse width signal VP put out from the voltage-pulse width converter 2 is proportional to $R_{iv}$. In short, the duty ratio D (T) is proportional to the resistance value of the temperature sensitive (resistance) element $R_T$, and thus to the temperature T. In addition, as found from this equation (5), with the temperature-pulse width conversion circuit X having the above-described construction, the duty ratio D (T) of the pulse width signal $V_P$ is not influenced by either the first reference voltage $V_1$ itself, or the characteristics of the voltage-pulse width converter 2 itself. Even if the first reference voltage $V_1$ is fluctuating or the inexpensive voltage-pulse width converter 2 is not linear or stable, a highly accurate temperature-pulse width conversion function can be secured by the compensating operation of the operational amplifier A due to the above-described feedback construction.

Figure 4B:
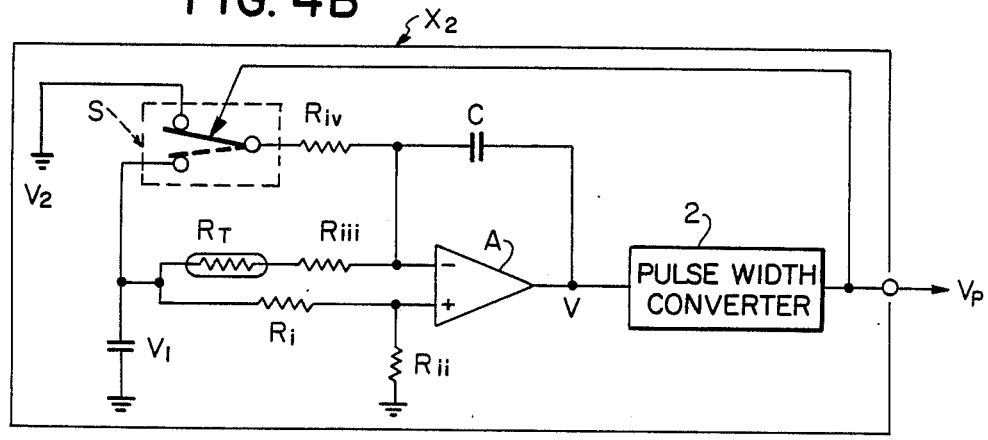
FIG. 4B is a circuit diagram of yet another alternate preferred embodiment of the present invention.
Figure 5A:
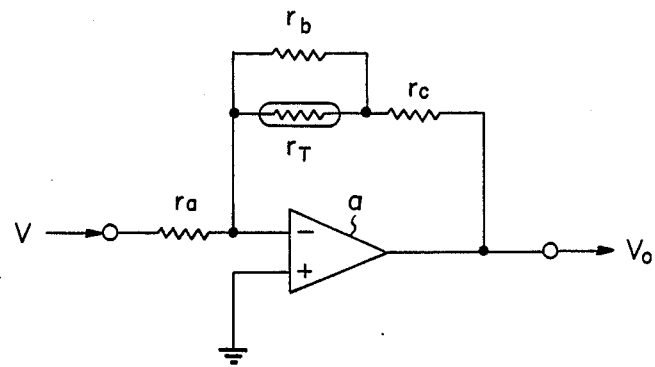
FIGS. 5A and 5B are circuit diagrams showing prior art temperature compensating circuits.
Figure 5B:
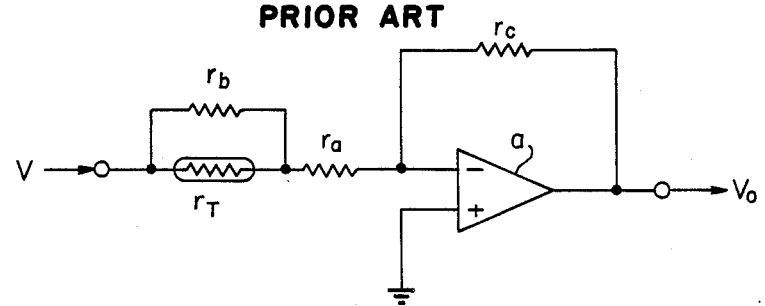

FIG. 4B shows a temperature-pulse width conversion circuit $X_2$ in which the voltage dividing resistors $R_1$, $R_2$ are omitted. The first reference voltage $V_1$ is supplied directly to the switch means S. The third resistor $R_{iii}$ is composed of the temperature sensitive (resistance) element $R_T$ and a linearity improving resistor $R_{iii}'$. The other elements, construction, and the operation are basically the same as shown in the above-described FIG. 4A. The parts having the same reference numerals function the same. Their description will not be repeated here.

From the above description, the temperature compensating circuit according to the present invention exhibits a number of advantages. In the case where the temperature compensating circuit is adapted to carry out temperature compensation for a plurality of measured signals, a plurality of temperature compensating circuits is provided with a pulse width signal, which is the detected temperature signal, from only one temperature-pulse width conversion circuit. Each temperature compensating circuit is remarkably simple in construction, to the extent that an operational amplifier is not required. Only one operational amplifier and temperature sensitive element, which are comparatively expensive, are utilized in the temperature-pulse width conversion circuit. This structure provides a remarkable reduction of the number of parts, and thus the simplification and miniaturization, as well as the reduction of the cost of production, can be achieved. The design of the temperature compensating circuit portion, depending upon the temperature characteristics of the respective measured signals and the polarity thereof can be very simply effected. Furthermore, since the respective temperature compensating circuits do not use operational amplifiers which are apt to produce errors (due to temperature drift and the like), the accuracy of the temperature compensation is remarkably improved in comparison with that available by conventional temperature compensating circuits.

What is claimed is:

1. A temperature compensating circuit in a measuring system producing a signal representative of the measured parameter, said compensating circuit comprising:
   temperature sensing pulse width conversion means for sensing the ambient temperature and generating a pulse signal having a duty ratio responsive to the sensed temperature; and
   at least one temperature compensating means for receiving the signal to be temperature compensated and generating a temperature compensated signal responsive to the pulse signal generated by said temperature sensing pulse width conversion means.

2. The temperature compensating circuit of claim 1 wherein said temperature compensating means comprises:
   a voltage dividing means for dividing the received signal into a large signal and a small signal.

3. The temperature compensating circuit of claim 2 wherein said temperature compensating means further comprises:
   a switching means responsive to the pulse signal generated by said temperature compensating means for alternately switching said large and small signals to the output, thereby generating a temperature compensated signal.

4. The temperature compensating circuit of claim 1 wherein said temperature sensing pulse width conversion means comprises:
   a temperature sensitive means for sensing its ambient temperature and affecting electrical parameters in the circuit in response thereto; and
   means responsive to the change in electrical parameters for generating pulse signals which vary in width in response to the change in electrical parameters.

5. The temperature compensating circuit of claim 4 wherein said temperature sensitive means comprises a thermistor.

6. The temperature compensating circuit of claim 4 wherein said pulse signal generating means comprises:
   a triangular wave generating means for generating triangular waves; and
   a comparative circuit means for receiving the triangular wave from said wave generating means and a signal from the circuit containing said temperature sensitive means.

7. The temperature compensating circuit of claim 4 wherein said temperature sensitive means comprises:
   an operational amplifier being supplied with a reference voltage at its input; and
   a temperature sensitive variable element connected in a feedback loop around said operational amplifier.

8. The temperature compensating circuit of claim 4 wherein said temperature sensitive means comprises:
   an operational amplifier being supplied with a reference voltage at its input;
   a temperature sensitive variable element in series with the reference voltage at the input to the operational amplifier; and
   switching means in the feedback loop around said operational amplifier for switching its output back into its input for periods determined by the width of the pulses from said pulse generating means.

9. The temperature compensating circuit of claim 4 wherein said temperature sensitive means comprises:
   an operational amplifier being supplied with a reference voltage at its input;
   a temperature sensitive variable element in the feedback loop around said operational amplifier; and
   switching means in series with said temperature sensitive variable element for switching the output of the operational amplifier back into its input for periods determined by the width of the pulses from said pulse generating means.

* * * * *